United States Patent [19]
Ahn

[11] Patent Number: 5,757,025
[45] Date of Patent: May 26, 1998

[54] INFRARED PHOTODETECTOR USING DELTA-DOPED SEMICONDUCTORS

[75] Inventor: Do Yeol Ahn, Kyungki-Do, Rep. of Korea

[73] Assignee: Goldstar Electron Co., Ltd., Cheongju, Rep. of Korea

[21] Appl. No.: 517,671

[22] Filed: Aug. 22, 1995

Related U.S. Application Data

[63] Continuation of Ser. No. 209,049, Mar. 11, 1994, abandoned.

[30] Foreign Application Priority Data

Mar. 17, 1993 [KR] Rep. of Korea ............ 4109/1993

[51] Int. Cl.$^6$ .................................................. H01L 31/11
[52] U.S. Cl. ........................ 257/21; 257/184; 257/439
[58] Field of Search ............................ 257/431, 448, 257/450, 21, 184, 439

[56] References Cited

U.S. PATENT DOCUMENTS

| | | | |
|---|---|---|---|
| 4,873,555 | 10/1989 | Coon et al. ............... | 307/311 |
| 4,882,609 | 11/1989 | Schubert et al. ........... | 257/657 |
| 4,894,526 | 1/1990 | Bethea et al. ............. | 250/211 R |
| 4,929,064 | 5/1990 | Schubert ................. | 359/276 |
| 4,974,044 | 11/1990 | Cunningham et al. ....... | 257/21 |
| 5,013,685 | 5/1991 | Chiu et al. ............... | 437/184 |
| 5,023,685 | 6/1991 | Bethea et al. ............. | 257/21 |
| 5,031,012 | 7/1991 | Cunningham et al. ....... | 257/80 |
| 5,060,234 | 10/1991 | Schubert et al. ........... | 372/45 |
| 5,311,009 | 5/1994 | Capasso et al. ........... | 257/21 |

OTHER PUBLICATIONS

Intersubband Optical Absorption In A Quantum Well With An Applied Electric Field, D. Ahn et al., Physical Review B, vol. 35 No. 8, Mar. 15, 1987.

App. Phys. Lett. 50 (5), Feb. 2, 1987, B.F. Levine et al., pp. 273–275.

*Primary Examiner*—Mark V. Prenty
*Assistant Examiner*—John Guay
*Attorney, Agent, or Firm*—Fleshner & Kim

[57] ABSTRACT

An infrared photodetector using δ-doped semiconductors capable of reducing the requirement to form a quantum well structure of high quality, reducing the need of a cooling device due to the operation at the room temperature, and controlling the wavelength of infrared ray detected by controlling the δ-doped concentration. The infrared photodetector includes a semiconductor substrate, an active layer formed over the semiconductor substrate, δ-doped layers formed in the active layer, the δ-doped layer having a doping concentration controlled for controlling a wavelength of infrared ray detected, a current injection layer formed over the active layer, a cap layer formed over the current injection layer, and an electrode formed on the cap layer.

30 Claims, 3 Drawing Sheets n+    i    n+

INFRARED PHOTODETECTOR USING DELTA-DOPED SEMICONDUCTORS

This application is a continuation of application Ser. No. 08/209,049 filed Mar. 11, 1994, now abandoned.

BACKGROUND OF THE INVENTION

1. Field of the Invention

The present invention relates to an infrared photodetector, and more particularly to an infrared photodetector using δ-doped semiconductors capable of detecting infrared ray with the wavelength of 3 to 30 µm at the room temperature.

2. Description of the Prior Art

Generally, infrared photodetectors for detecting far-infrared ray with the wavelength of 3 to 30 µm which exhibit various latent applicabilities to military and civilian uses are classified into the p-i-p diode type using II-VI compound semiconductors such as HgCdTe (HCT) and the type using a transition between subbands of a quantum well.

In fabrication of infrared photodetectors of the p-i-n diode type, a growth technique such as the molecular beam epitaxy (NME) is required for solving delicate growth conditions of II-VI compound semiconductors. In this case, a p-n doping technique and a metal electrode forming technique are additionally needed.

In fabrication of infrared photodetectors of the type using the transition between subbands of the quantum well, there is required a growth technique capable of forming a quantum well of high quality by use of the known technique such as the MBE or the metalorganic chemical vapor deposition (MOCVD). In similar to the above-mentioned case, this case requires additionally a technique for forming n doped regions and metal electrodes. This technique is disclosed in U.S. Pat. No. 4,873,555 and D. Ahn and S. L. Chuang, Phys. Rev. B 35, 4149 (1897), and B. F. Levine et al., Appl. Phys. Lett. 50 273 (1987).

On the other hand, the infrared photodetectors of the p-i-p diode type using HCT have already been disclosed in detail in the literature and, accordingly, detailed description thereof will be omitted.

Conventional infrared photodetectors of the type using the transition between subbands of quantum well to which the present invention relates have a $n^+$-i-$n^+$ structure, as shown in FIG. 1. The i region in the $n^+$-i-$n^+$ structure is an undoped intrinsic region and includes a quantum well structure. When a voltage is applied to the opposite $n^+$ regions of the conventional structure, the i region operates as an actual current cutoff layer. As a result, no current flows so long as no external infrared ray enters. When an external infrared ray enters, electrons of based state in the quantum well of the i region are exited at the secondary subband. The excited electrons tunnel the electron barrier, thereby enabling the current to flow. Accordingly, the incident infrared ray can be detected. In this case, the wavelength of the detected infrared ray can be more or less controlled by controlling the width of the quantum well and, thereby, the energy difference between the subbands.

However, the conventional infrared photodetectors have a problem that they are required to be kept at a low temperature of not more than 77° K by use of liquid nitrogen in operation because relatively high dark current is generated. On the other hand, the conventional infrared photodetectors of the type using the transition between subbands of quantum well can operate at the room temperature because relatively low dark current is generated. As a result, the latter infrared photodetectors require no low temperature condition provided by the liquid nitrogen in operation. However, these infrared photodetectors have a problem that quantum wells of high quality should be formed.

SUMMARY OF THE INVENTION

Therefore, an object of the invention is to solve the above-mentioned problems encountered in the prior arts and to provide an infrared photodetector using δ-doped semiconductors capable of reducing the requirement to form a quantum well structure of high quality, reducing the need of a cooling device due to the operation at the room temperature, and controlling the wavelength of infrared ray detected by controlling the δ-doped concentration.

In accordance with the present invention, this object can be accomplished by providing an infrared photodetector comprising: a semiconductor substrate; an active layer formed over said semiconductor substrate; at least one δ-doped layer formed in said active layer, said δ-doped layer having surface doping concentration adjusted for controlling a wavelength of infrared ray detected; a current injection layer formed over the active layer; a cap layer formed over said current injection layer; and an electrode formed on said cap layer.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENTS

Figure 1:
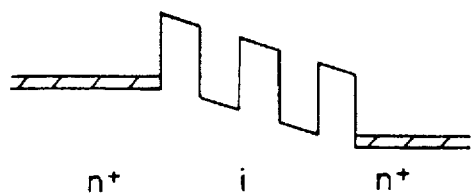
FIG. 1 is a schematic energy band diagram of an infrared photodetector using a conventional quantum well structure.
Figure 2:
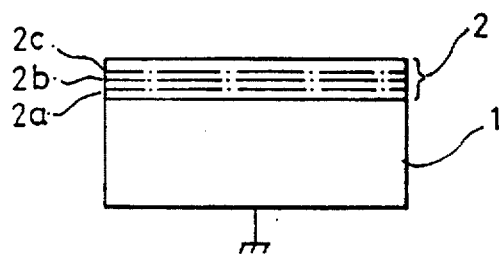
FIG. 2 is a sectional view illustrating a δ-doped semiconductor structure for an infrared photodetector in accordance resent invention wherein a semiconductor layer including three δ-doped is formed over a semiconductor substrate.

Referring to FIG. 2, there is illustrated a δ-doped semiconductor structure for an infrared photodetector in accordance with the present invention.

As shown in FIG. 2, the structure comprises a semiconductor substrate 1 which is comprised of, for example, a GaAs substrate, an InGaP substrate or an InP substrate. Preferably, the semiconductor substrate 1 is the GaAs substrate. The structure further comprises an active layer 2 made of the same material as that of the semiconductor substrate 1. The active layer 2 is grown in the form of a single crystal layer over the semiconductor substrate 1 by use of the MBE or the MOCVD. During the single crystal growth of the active layer 2, δ-doped layers 2a, 2b and 2c are deposited which are comprised of dopants constituted by one or two monolayers.

In other words, after the active layer 2 is grown in the form of the single crystal layer over the semiconductor substrate 1 to a predetermined thickness, the single crystal growth thereof is temporarily stopped. Thereafter, an n type impurity such as Si Se, Sn, or Te is deposited over the active layer 2 at a predetermined carrier density, thereby forming one or two monolayers.

The monolayer or monolayers constitute the δ-doped layer 2a having a thickness of 5 to 30 Å. As the above-mentioned procedures are repeated twice, the δ-doped layers 2b and 2c are formed in the active layer 2 at respective predetermined carrier densities during the single crystal growth of the active layer 2.

Figure 3:
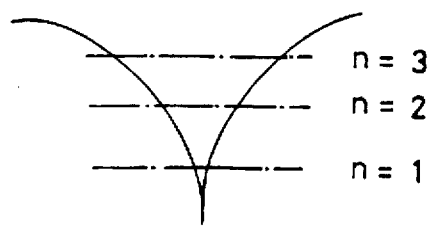
FIG. 3 is a schematic view illustrating potential profile, against electrons, of the δ-doped layers of FIG. 2.

As a result, the active layer 2 has quantum well barriers against electrons in states of n=1, and n=2 respectively corresponding each of the δ-doped layers 2a, 2b and 2c, as shown in FIG. 3. In this case, the electrons confined in the quantum wells are present at a quantized state.

Figure 4:
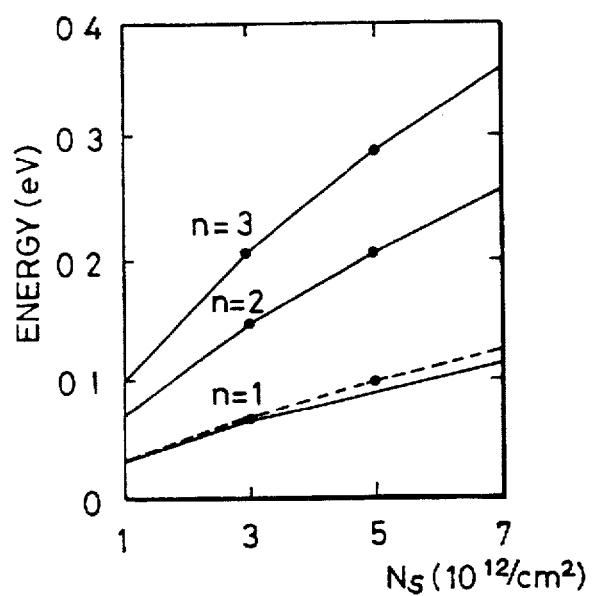
FIG. 4 is a graph illustrating a relation between doped concentration of each δ-doped layer shown in FIG. 2 and energy of electrons confined therein.

The energy level of the electrons confined in each quantum well present in the active layer 2 can be expressed by a surface concentration function Ns of each corresponding δ-doped layer, as shown in FIG. 4. That is, the energy separation of the electrons between different states is increased when the δ-doped concentration is increased. The energy difference between the states of n=1 and n=2 is proportional to $Ns^{1/3}$.

Accordingly, the energy difference of electrons between the ground state and the excited state can be controlled by the surface concentration Ns of each δ-doped layer.

As a result, the transition energy of electrons from the ground state to the excited state is controlled by the surface charge concentration. The wavelength λ of light absorbed by the electrons can be derived by the following equation (1):

$$\lambda = \frac{1.24}{\Delta E} \quad (1)$$

wherein, ΔE represents the energy seperation in the δ-doped layers.

For example, where excitation of electrons is generated when the energy difference ΔE between the states of n=1 and n=2 is 0.1 eV, the wavelength of absorbed light is 12.4 μm. Thus, the wavelength of absorbed light is determined by the δ-doped concentration of the δ-doped layers 2a, 2b and 2c.

Figure 5:
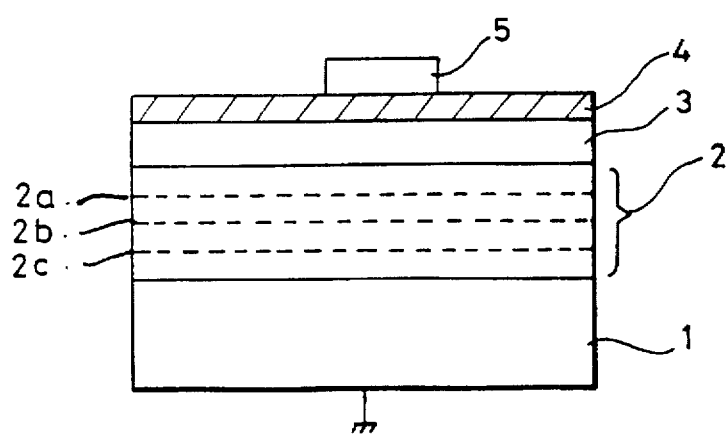
FIG. 5 is a sectional view of an infrared photodetector having the δ-doped semiconductor structure accordance with the present invention.

Referring to FIG. 5, there is illustrated an infrared photodetector using the δ-doped semiconductor structure of FIG. 2 in accordance with the present invention. In FIG. 5, elements corresponding to those in FIG. 2 will be denoted by the same reference numerals.

As shown in FIG. 5, the infrared photodetector comprises a semiconductor substrate 1 which is comprised of, for example, a GaAs substrate, an InGaP substrate or an InP substrate. Preferably, the semiconductor substrate 1 is the GaAs substrate. The infrared photodetector further comprises an active layer 2 made of the same material as that of the semiconductor substrate 1. The active layer 2 is grown in the form of a single crystal layer over the semiconductor substrate 1 by use of the MBE or the MOCVD.

During the single crystal growth of the active layer 2, δ-doped layers 2a, 2b and 2c are deposited which are comprised of dopants constituted by one or two monlayers. In other words, after the active layer 2 is grown in the form of the single crystal layer over the semiconductor substrate 1 to a predetermined thickness, the single crystal growth thereof is temporarily stopped. Thereafter, n-type dopant is deposited over the active layer 2 at a predetermined carrier density, thereby forming one or two monolayers.

The monolayer or monolayers constitute the δ-doped layer 2a having a thickness of 5 to 30 Å. As the above-mentioned procedures are repeated twice, the δ-doped layers 2b and 2c are formed in the active layer 2 at respective predetermined carrier densities during the single crystal growth of the active layer 2. Subsequently, a current injection layer 3 is deposited over the active layer 2. The current injection layer 3 has an energy band gap smaller than those of the semiconductor substrate 1 and the active layer 2.

The current injection layer 3 is a layer doped with an n type impurity in a high concentration. Thereafter, a cap layer 4 is deposited over the current injection layer 3. The cap layer 4 is doped with an n-type dopant in a high concentration. Finally, a metal electrode 5 is formed on the cap layer 4.

Figure 6:
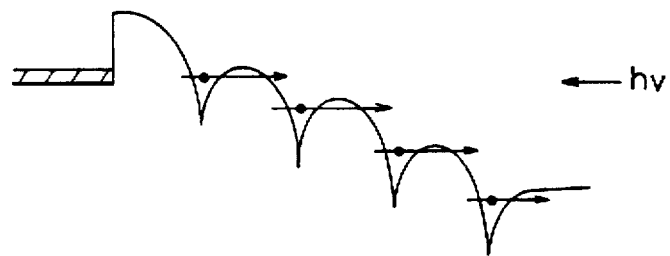
FIG. 6 is a schematic energy band diagram of the infrared photodetector of FIG. 5.

The infrared photodetector having the above-mentioned structure has energy bands shown in FIG. 6. By the energy bands, energy barriers are formed by virtue of the impurity concentration difference among the δ-doped layers 2a, 2b and 2c of the active layer 2 in the infrared photodetector. As a result, no current flows when an external electric field is applied to the infrared photodetector. When a light enters the infrared photodetector at this state, electrons present in the δ-doped quantum wells carry out their transition from the ground state to the excited state, so that they can tunnel the quantum barriers, thereby enabling the current to flow. Consequently, the incident infrared ray can be detected by the flowing current.

Figure 7:
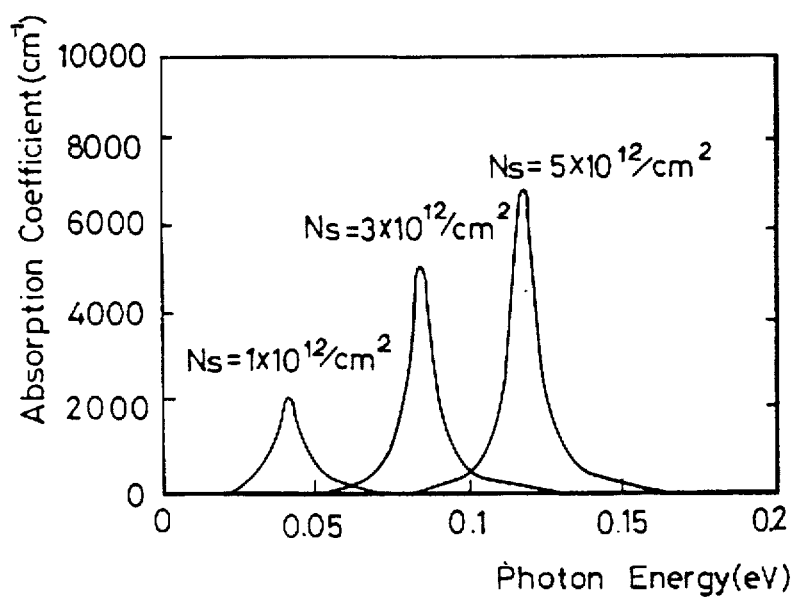
FIG. 7 is a graph of photon energy and light absorption coefficient versus doped concentration of the δ-doped semiconductor layer shown in FIG. 5.

As shown in FIG. 7, the light absorption coefficient of the subband of each δ-doped layer is increased when the surface concentration Ns of the δ-doped layer is increased. This means that the energy of light absorbed, namely, the photon energy can be controlled by controlling the surface concentration of the δ-doped layer.

For example, when the concentration of the δ-doped layer is $1\times10^{12}/cm^2$, the wavelength of the absorbed infrared ray is 30 μm in accordance with the equation (1) because the photon energy is 40 meV. On the other hand, when the concentration of the δ-doped layer is $5\times10^{12}/cm^2$, the wavelength of the absorbed infrared ray is 10 μm in accordance with the equation (1) because the photon energy is 120 meV.

In the infrared photodetector of the present invention, accordingly, infrared ray having a long wavelength of 3 to 30 μm can be detected at the room temperature because the active layer 2 has a sufficiently high light absorption coefficient.

As apparent from the above description, the present invention provides an infrared photodetector using δ-doped semiconductor layers capable of controlling the wavelength of infrared ray detected by controlling surface concentrations of the δ-doped layers.

Although the preferred embodiment of the invention have been disclosed for illustrative purpose, those skilled in the art will appreciate that various modifications, additions and substitutions are possible, without departing from the scope and spirit of the invention as disclosed in the accompanying claim.

What is claimed is:

1. A photodetector comprising:
   a semiconductor substrate;
   a first quantum well active layer formed on said semiconductor substrate, wherein a first delta-doped layer is formed within said first quantum well active layer and having a first prescribed surface doping to create a quantum well having a plurality of intersubbands such that intersubband transition of electrons allows detection of light of a prescribed wavelength;

a current injection layer formed over said first quantum well active layer;

a cap layer formed over said current injection layer; and electrodes on said cap layer and said semiconductor substrate.

2. The photodetector of claim 1, wherein said semiconductor substrate and said first quantum well active layer are made of compounds from Group III–V elements.

3. The photodetector of claim 2, wherein said semiconductor substrate and said first quantum well active layer are made of same materials selected from a group consisting of GaAs, InGaP and InP.

4. The photodetector of claim 3, wherein said cap layer and said current injection layer are made of the same material as the semiconductor substrate.

5. The photodetector of claim 1, wherein said plurality of intersubbands equals two intersubbands.

6. The photodetector of claim 1, wherein the light of the prescribed wavelength is infrared ray.

7. The photodetector of claim 6, wherein the prescribed wavelength is in a range of about 3–30 microns.

8. The photodetector of claim 1, further comprising a second quantum well active layer formed between said first quantum well active layer and said current injection layer, and having a second delta-doped layer of a second prescribed surface doping formed within said second quantum well active layer for intersubband transition of electrons.

9. The photodetector of claim 8, wherein said first and second prescribed doping concentration are the same.

10. The photodetector of claim 8 further comprising a third quantum well active layer formed between said second quantum well active layer and said current injection layer, and having a third delta-doped layer of a third prescribed surface doping formed within said third quantum well active layer for intersubband transition of electrons.

11. The photodetector of claim 10, wherein said first, second and third surface dopings are the same.

12. The photodetector of claim 11, wherein said first, second and third surface dopings equal $N*10^{12}/cm^2$, wherein N is a real number.

13. The photodetector of claim 12, wherein N equals 1.

14. The photodetector of claim 12, wherein N equals 5.

15. The photodetector of claim 1, wherein said first delta-doped layer is a monoatomic layer.

16. The photodetector of claim 15, wherein said first delta-doped layer has a range of thickness of about 5 to 30 Å.

17. The photodetector of claim 1, wherein said first delta-doped layer is doped with N-type dopant.

18. A photodetector comprising:

a semiconductor substrate;

a quantum well active layer formed on said semiconductor substrate, wherein said quantum well active layer includes a plurality of delta-doped layers, each delta-doped layer having a prescribed surface doping adjusted for intersubband transition of electrons to detect light of a prescribed wavelength;

a current injection layer formed over said quantum well active layer;

a cap layer formed over said current injection layer; and electrodes on said cap layer and said semiconductor substrate.

19. The photodetector of claim 18, wherein said semiconductor substrate and said quantum well active layer are made of compounds from Group III–V elements.

20. The photodetector of claim 19, wherein said semiconductor substrate and said quantum well active layer are made of same materials selected from a group consisting of GaAs, InGaP and InP.

21. The photodetector of claim 20, wherein said cap layer and said current injection layer are made of the same material as the semiconductor substrate.

22. The photodetector of claim 18, wherein the light of the prescribed wavelength is infrared ray.

23. The photodetector of claim 22, wherein the prescribed wavelength is in a range of about 3–30 microns.

24. The photodetector of claim 18, said surface doping of each delta doped layer is the same.

25. The photodetector of claim 18, wherein each delta-doped layer is a monoatomic layer.

26. The photodetector of claim 25, wherein said each delta-doped layer has a range of thickness of about 5 to 30 Å.

27. The photodetector of claim 18, wherein said delta-doped layer is doped with N-type dopant.

28. The photodetector of claim 18, wherein said prescribed surface doping equals $N*10^{12}/cm^2$, wherein N is a real number.

29. The photodetector of claim 28, wherein N equals 1.

30. The photodetector of claim 28, wherein N equals 5.

* * * * *